(12) United States Patent
Lung

(10) Patent No.: US 6,960,801 B2
(45) Date of Patent: Nov. 1, 2005

(54) HIGH DENSITY SINGLE TRANSISTOR FERROELECTRIC NON-VOLATILE MEMORY

(75) Inventor: Hsiang-Lan Lung, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/882,480

(22) Filed: Jun. 14, 2001

(65) Prior Publication Data

US 2002/0190274 A1   Dec. 19, 2002

(51) Int. Cl.[7] ............................................. G11C 11/22
(52) U.S. Cl. ..................... 257/295; 257/300; 257/310
(58) Field of Search ............................. 365/145; 438/3, 438/279; 257/295, 314–326, 389

(56) References Cited

U.S. PATENT DOCUMENTS

| | | | |
|---|---|---|---|
| 5,300,799 A * | 4/1994 | Nakamura et al. | 257/295 |
| 5,506,748 A * | 4/1996 | Hoshiba | 361/321.4 |
| 5,559,733 A * | 9/1996 | McMillan et al. | 365/145 |
| 5,708,284 A * | 1/1998 | Onishi | 257/295 |
| 5,731,608 A | 3/1998 | Hsu et al. | |
| 5,798,548 A * | 8/1998 | Fujiwara | 257/319 |
| 5,877,054 A * | 3/1999 | Yamauchi | 438/264 |
| 5,959,879 A * | 9/1999 | Koo | 257/295 |
| 6,100,558 A * | 8/2000 | Krivokapic et al. | 257/295 |
| 6,172,392 B1 * | 1/2001 | Schmidt et al. | 257/315 |
| 6,191,441 B1 * | 2/2001 | Aoki et al. | 257/295 |
| 6,294,807 B1 * | 9/2001 | Chittipeddi et al. | 257/295 |
| 6,339,008 B1 * | 1/2002 | Takenaka | 438/396 |
| 6,420,742 B1 * | 7/2002 | Ahn et al. | 257/288 |

FOREIGN PATENT DOCUMENTS

WO   WO 00/28596 A1 *   5/2000

OTHER PUBLICATIONS

Jaeger, vol. V: Introduction to Microelectronic Fabrication, Addison-Wesley Publiching Company 1993, pp. 79.*
"Application of $Sr_2Nb_2O_7$ Family Ferroelectric Films for Ferroelectric Memory Field Effect Transistor", Copyright 1998 Publication Board, *Japanese Journal of Applied Physics*, vol. 37, pp. 5207-5210.

* cited by examiner

*Primary Examiner*—Howard Weiss
*Assistant Examiner*—Marcos D. Pizarro
(74) *Attorney, Agent, or Firm*—Workman Nydegger

(57) ABSTRACT

A single transistor ferroelectric memory ("FEM") cell, useful for high density ferroelectric random access memory ("FRAM") applications, and a method for making the same, are herein disclosed. The FEM cell comprises a FEM gate unit having a top electrode, a ferroelectric material layer, and a bottom electrode. The FEM gate unit is disposed above a semiconductor substrate having defined on it a well region and channel of a first conductive type and a source and drain of a second conductive type. A conductive upper polysilicon layer covers both the FEM gate unit and a portion of the source region and is in electrical communication with the top electrode of the FEM gate unit. The drain is in electrical communication with the bottom electrode of the FEM gate unit and serves as the bit line for the FEM memory cell. The source is shared between the present memory cell and an adjacent cell.

19 Claims, 4 Drawing Sheets

HIGH DENSITY SINGLE TRANSISTOR FERROELECTRIC NON-VOLATILE MEMORY

BACKGROUND OF THE INVENTION

1. The Field of the Invention

The present invention relates to non-volatile memory cells. More particularly, the present invention relates to an apparatus and method for providing high-density single transistor memory cells for use in semiconductor devices.

2. The Relevant Technology

It is well known that ferroelectric materials may be used to store information in a non-volatile memory cell. Ferroelectric materials possess two characteristics that make them ideal for such use: a bi-stable polarization (positive or negative) that corresponds to a "1" or a "0" digital logic state, and the ability to retain such states in the absence of electrical power to the memory cell. The polarization effect demonstrated by ferroelectric materials is best understood as a non-zero charge per unit area on the ferroelectric device (such as a capacitor) that exists at zero voltage.

A variety of ferroelectric memory ("FEM") structures are known in the art, including ferroelectric random access memories ("FRAMs") that employ two transistor-two capacitor (2T/2C) and one transistor-one capacitor (1T/1C) FEM cells on integrated circuit chips. In such FEM cells, the capacitor is generally made by sandwiching a thin ferroelectric film between two electrically conductive electrodes. Also known in the art is the use of a ferroelectric film to form a field effect transistor ("FET"), where the gate of the FET includes a ferroelectric material. A popular type of such ferroelectric gate-controlled devices is the metal-ferroelectric-metal-oxide-silicon ("MFMOS") FET, often incorporated in FRAMs. FRAMs having MFMOS FET structures are often desired over the transistor-capacitor configurations because they occupy less area on the semiconductor surface, and because they provide non-destructive readout ("NDRO") of the FRAM cells. With the ever-present drive for circuit size reduction in integrated circuit chip fabrication, however, attention is directed to creating smaller, more compact FEM cells. A need therefore exists to produce a MFMOS FRAM cell that may be incorporated into a high density memory cell array while, at the same time, preserving FRAM circuit designs.

SUMMARY OF THE INVENTION

It is therefore an object of the present invention to provide a non-volatile FEM cell with nondestructive readout characteristics for use in high density FRAM cell arrays. Briefly summarized, embodiments of the present invention are directed to a FEM cell suitable for use in high-density memory cell arrays, and a method for making such cells. Each FEM cell comprises a single transistor having a gate unit comprising a ferroelectric thin film deposited between a top and bottom electrode. The ferroelectric gate unit resides atop a semiconductor substrate having defined on it doped regions of a first and second conductive type that define a well and channel region, and source/drain regions, respectively. A gate oxide and a lower polysilicon layer are disposed between the ferroelectric gate unit and semiconductor substrate. An upper polysilicon layer covers the ferroelectric gate unit and electrically connects it with the source region on the semiconductor substrate. The sides of the ferroelectric gate unit are sealed with an appropriate sealant, such as $Si_3N_4$, to prevent damage to the ferroelectric material, during chip fabrication.

The FEM cell of the present invention is preferably integrated in a memory cell array on a integrated circuit chip with the array having horizontal rows and vertical columns of memory cells. Each FEM cell within such a memory array includes a drain, channel, and ferroelectric gate unit, but the source is shared between the present FEM cell and an adjacent cell. In this way, a higher density of FEM cells may be configured within the memory cell array.

In operation, each FEM cell of a memory array is electrically connected to a bit line, source line, and word line. The drain region of the FEM cell comprises the bit line, the upper polysilicon layer comprises the word line, and the shared source region defines the source line. In this manner, the top and bottom electrodes of the ferroelectric gate unit are electrically coupled to the word line and bit line, respectively. These electrical couplings enable the ferroelectric material between the top and bottom electrodes to be polarized in connection with program and erase operations. Through such program and erase operations, the ferroelectric material is polarized into one of its bi-stable orientations corresponding to a "1" or "0" digital logic. The logic state is maintained by the ferroelectric material after the program or erase operation is completed and electrical power is removed from the FEM cell. A subsequent read operation senses the logic state of the ferroelectric material via accompanying circuitry. Thus the FEM cell memory is stored in a non-volatile manner to be subsequently read without disturbing the logic state of the cell. Memory cell densities of 16 megabits ("Mbits") and above are possible with the present invention.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above recited and other advantages and features of the invention are obtained, a more particular description of the invention briefly described above will be rendered by reference to specific embodiments thereof that are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Figure 1:
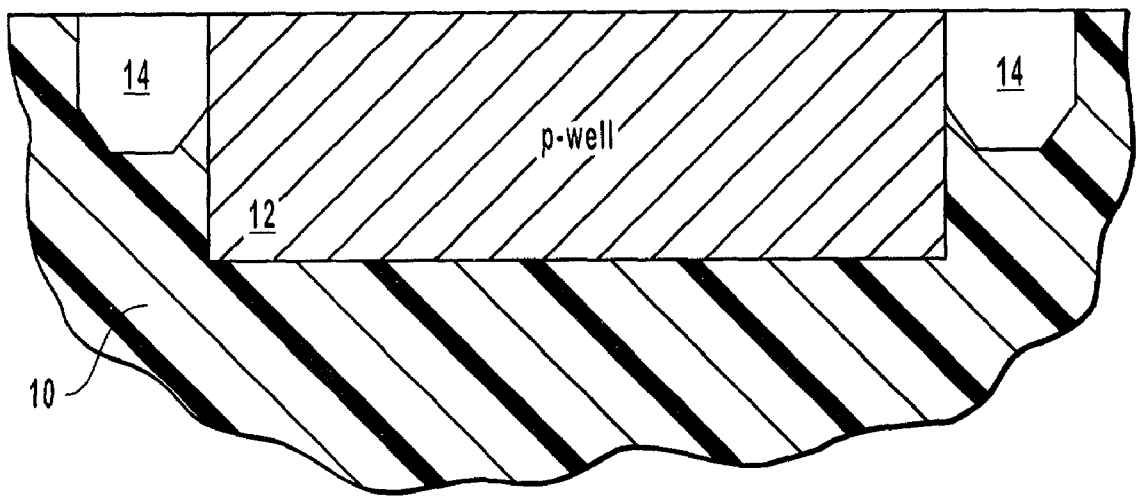
FIG. 1 is a cross sectional side view of a semiconductor substrate upon which a single-transistor ferroelectric memory cell is constructed according to the present invention.

A ferroelectric memory ("FEM") cell of the present invention is constructed in the manner described below. Referring to FIG. 1, a semiconductor substrate 10 is shown upon which a FEM cell is fabricated. Preferably, the substrate 10 comprises silicon, though other suitable substrates may also be used. A p-well layer 12 is formed in the substrate 10, and is also referred to herein as a region of a first conductive type. The p-well 12 is preferably formed by boron or boron compound ion implantation and diffusion techniques well known in the art, but other suitable substances may be employed as well to form the p-well. Alternatively, other techniques, such as plasma immersion ion implantation, gas immersion laser doping, or plasma assisted doping, may be used to dope this and other doped structures in the FEM cell. The ion implantation is, for example, conducted at an energy of 50 KeV and at a dosage of $8\times10^{12}$ cm$^{-2}$. The p-well 12 is isolated from other areas of the substrate 10 preferably by a shallow trench isolation process, thus forming isolation trenches 14. Other isolation methods may be employed to isolate the substrate 10 including, for example, field oxide application.

Figure 2:
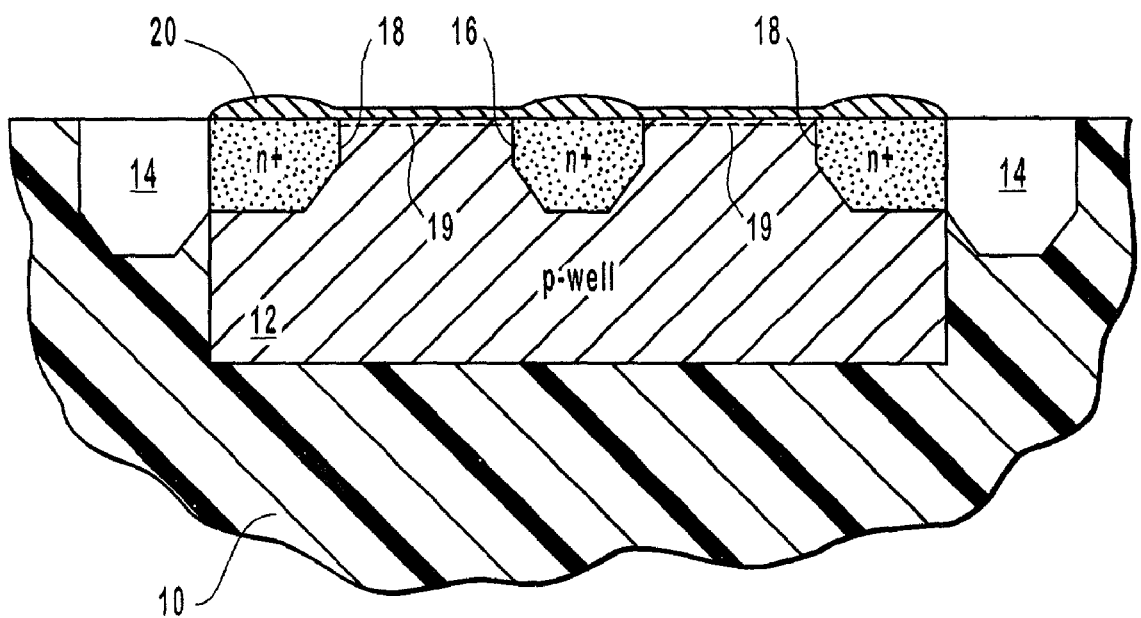
FIG. 2 is a cross sectional side view of a step in the construction of the FEM cell.

Referring now to FIG. 2, three shallow n-type regions, also referred to herein as regions of a second conductive type and comprising a source region 16 and two drain regions 18, are implanted on the p-well 12 preferably by ion implantation and diffusion. Preferably, arsenic is employed as the dopant at an energy of about 70 KeV and a dosage of about $3\times10^{15}$ cm$^2$, though again it is appreciated that other appropriate dopants could be utilized including, for example, phosphorus. Each drain region 18 is oppositely disposed on either side of the source region 16, with each drain region preferably having a spacing from the source region of about 0.18 to 0.35 μm. A channel 19 comprises the shallow portion of the p-well 12 that resides in the spacing between the source 16 and each drain 18. The p-well 12, source and drain regions 16 and 18, and the channel 19 are diffused to provide the proper electrical characteristics to such regions. A gate oxide layer 20, preferably SiO$_2$, is grown over the source 16, drains 18, and p-well 12 using known processes, including thermal oxidation or chemical vapor deposition ("CVD").

Figure 3:
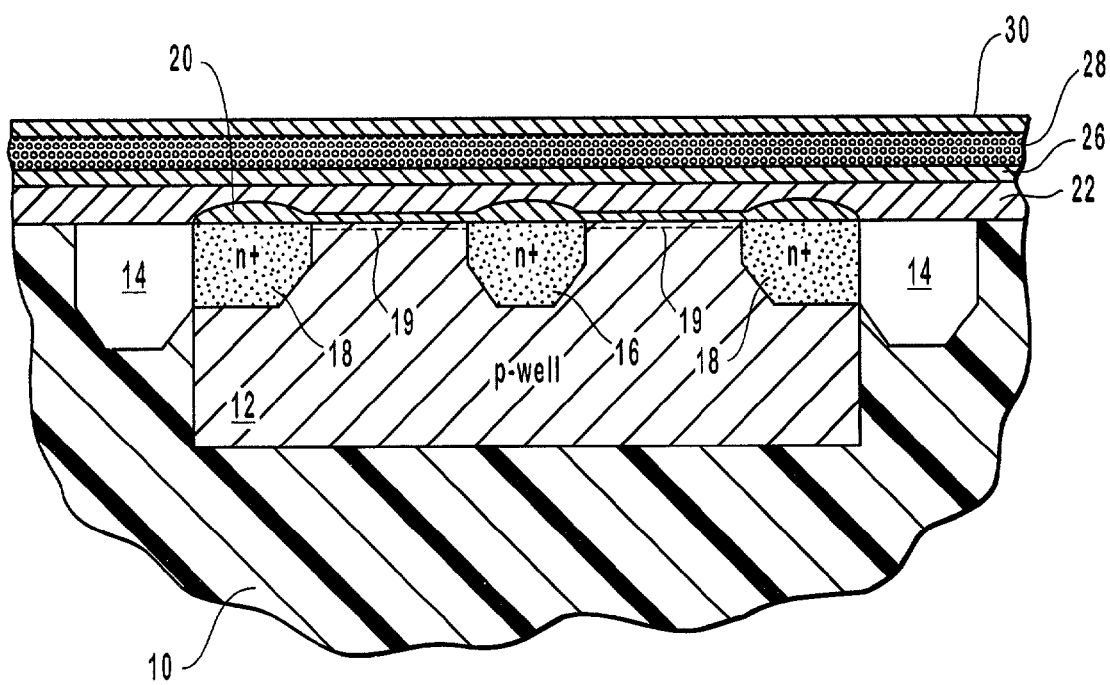
FIG. 3 is a cross sectional side view of a further step in the construction of the FEM cell.

FIG. 3 depicts the next step in the FEM cell construction, that being the deposition of a lower polycrystalline silicon ("polysilicon") layer 22 over the gate oxide 20. After being deposited to a preferred thickness of about 500 to 700 Å, the lower polysilicon layer 22 is doped to the desired polarity, which preferably is n-type. The lower polysilicon layer 22 assists in protecting the gate oxide 20 from damage during further process steps.

Formation of a FEM gate unit is begun atop the polysilicon layer 22 by depositing a bottom electrode 26. The bottom electrode 26 is deposited by known deposition processes, such as physical vapor deposition ("PVD") or chemical vapor deposition ("CVD"), and preferably comprises platinum. Alternatively, other materials that may be used to form the bottom electrode 26 include ruthenium, iridium, RuO, or IrO$_2$, or other suitable noble metal oxides or alloys thereof. The thickness of the electrode 26 is from about 500 to 1,500 Å. It is noted that, in an alternative embodiment, the lower polysilicon layer 22 may be eliminated from the FEM cell. In such an embodiment, the bottom electrode 26 would provide the protective function for the gate oxide 20 formerly provided by the lower polysilicon layer 22 as noted above.

Next, a ferroelectric material layer 28 is deposited on the bottom electrode 26 using known techniques such as CVD, sputtering, and sol-gel processing. Preferably, the ferroelectric material 28 comprises Pb(Zr, Ti)O$_3$, known as lead zirconate titanate oxide ("PZT"), and is deposited to a thickness from about 800 to 2,000 Å. Alternative ferroelectric materials that may also be used include SrBiTa$_2$O$_9$, known as strontium bismuth tantalite oxide ("SBT"), Pb$_5$Ge$_3$O$_{11}$, and BaTiO$_3$.

A top electrode 30 is then formed over the ferroelectric material 28 to a thickness of from about 500 to 1,500 Å. As with the bottom electrode 26, the top electrode 30 is deposited by known deposition processes, such as PVD or CVD, and preferably comprises platinum. Alternatively, other materials that may be used to form the top electrode 30 include ruthenium, iridium, RuO, or IrO$_2$, or other suitable noble metal oxides or alloys thereof.

Figure 4:
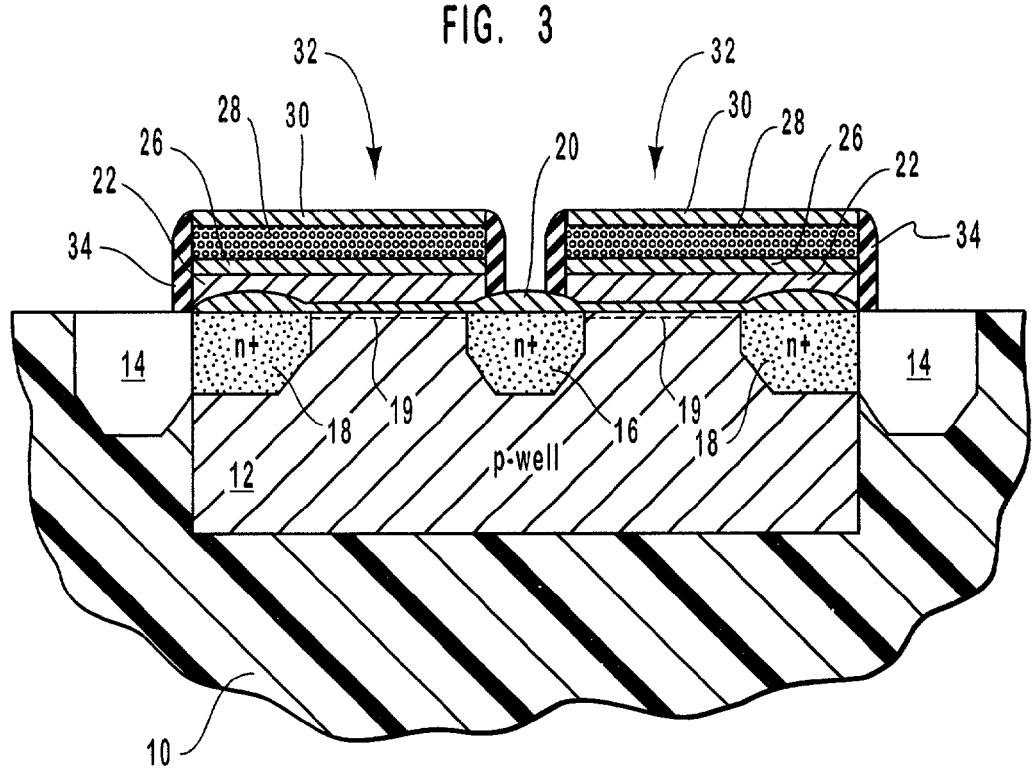
FIG. 4 is a cross sectional side view of a further step in the construction of the FEM cell.

At this point the top electrode 30, ferroelectric material 28, bottom electrode 26, and lower polysilicon layer 22 are cut and sized by etching or similar techniques above the source 16 such that two FEM gate units 32 are formed thereby as shown in FIG. 4. Each FEM gate unit 32 is disposed above a respective drain 18 and a portion of the p-well 12 defined in the semiconductor substrate 10. Each of the two FEM gate units 32 are disposed partially over the source 16. A sealing layer 34 is applied to the sides of each FEM cell 32 to protect the ferroelectric material 28 from hydrogen damage during further fabrication process steps. The sealing layer is preferably deposited by CVD and comprises of Si$_3$N$_4$, though Al$_2$O$_3$ or similar substances may also be employed as appreciated by one of skill in the art. It is noted here that the various layers of the FEM gate unit 32 need not precisely resemble the configuration as shown, as their shapes may be modified by various fabrication process steps. For the sake of clarity, however, the FEM gate unit 32 is depicted having aligned and contiguous side walls.

Figure 5:
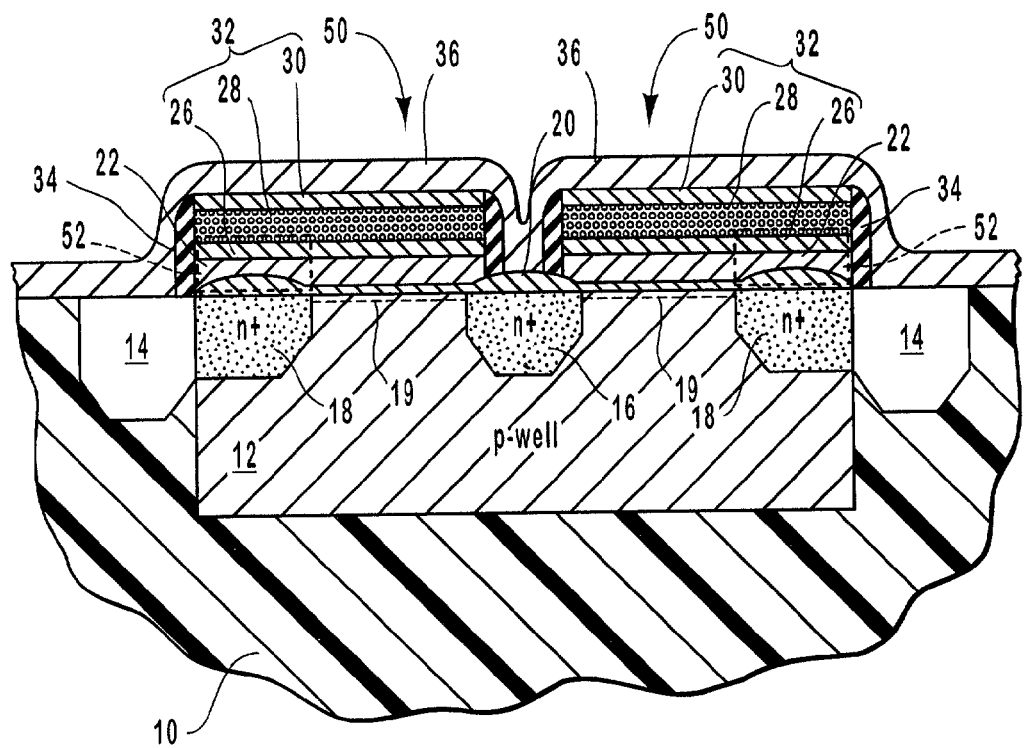
FIG. 5 is a cross sectional side view of two FEM cells constructed according to the present invention.

Referring now to FIG. 5, an upper polysilicon layer 36 is shown deposited atop both FEM gate units 32, isolation trenches 14, and the region above the source 16. The upper polysilicon layer is preferably approximately 800 to 1,500 Å in thickness and appropriately doped so as to be electrically conductive. Such doping may be provided by doping As or P during the CVD polysilicon process. At this point further complimentary metal-oxide-semiconductor ("CMOS") fabrication process steps may be performed as is known in the art, including metallization steps that connect conductive electrodes (not shown) to the source 16, the drain 18, and the upper polysilicon layer 36. Two FEM cells 50 as described above are therefore depicted in FIG. 5.

Figure 6:
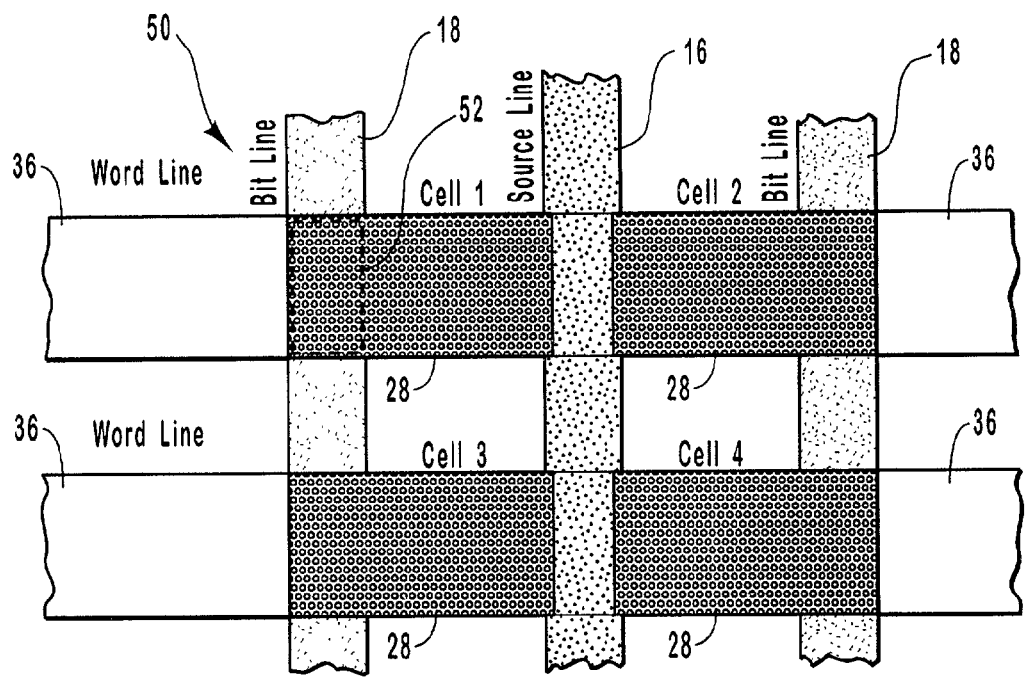
FIG. 6 is a representative top view of various FEM cells disposed in a memory cell array in accordance with the present invention.

FIG. 6 is a top view of various components of several FEM cells 50 arranged in a memory cell array. The figure depicts the source 16 and the drains 18 as doped regions extending in a columnar fashion along the semiconductor substrate 10 and upper polysilicon layers 36 partially shown extending laterally along the top portion of the various cells. Other components of the FEM cell 50 have been omitted from the figure for clarity. In the FEM cell 50 of the present invention, the source 16 serves as the source line to the cell, while the drain 18 serves as the bit line and the upper polysilicon layer 36 serves as the word line. The word line (upper polysilicon layer) is in electrical communication with the top electrode 30 of the FEM gate unit 32, while the bit line (drain) overlaps the bottom electrode 26 through a coupling region 52, which resides directly above the drain 18 as outlined in FIGS. 5 and 6. This electrical scheme is referred to herein as drain-side coupling and it comprises a means for controlling the polarization of the ferroelectric material. In this way, the FEM cell 50 is programmed and non-destructively read, as described below.

Figure 7:
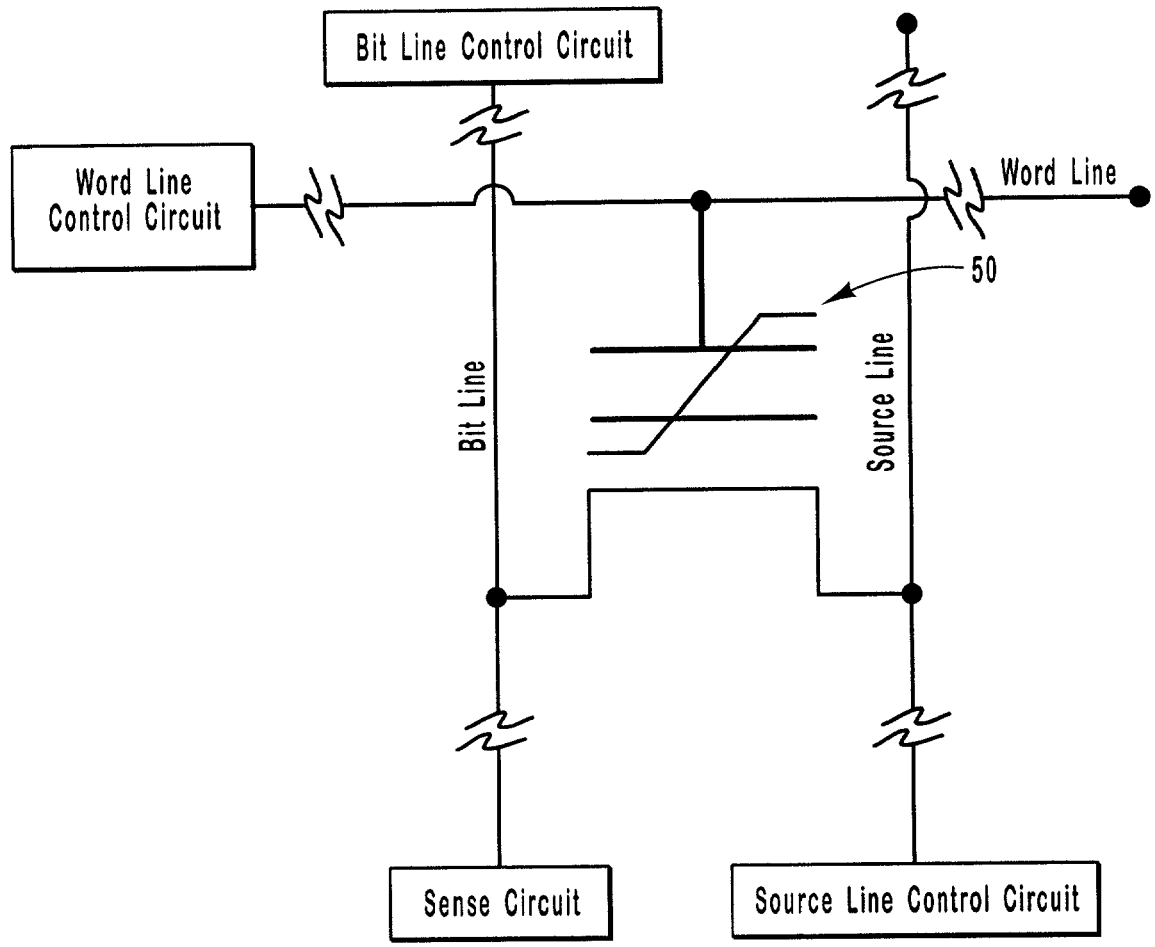
FIG. 7 is an electrical diagram depicting the circuitry of a FEM cell within a memory cell array.

FIG. 7 is an electrical diagram of one of the two FEM cells 50 of FIG. 5. The FEM cell 50 disclosed herein represents a ferroelectric gate, single-transistor MFMOS transistor. The FEM cell 50, formed according to the present invention, is an efficient non-volatile storage device because the FEM gate unit 32, disposed above the channel 19, is able to shift the polarity of the channel, thus reducing the threshold voltage, i.e., the voltage potential that needs to exist between the source 16 and the drain 18 in order for an electrical current to be produced. A low threshold voltage allows current to more easily flow from the source 16 to the drain 18 via the channel 19. Conversely, the FEM gate unit 32 may shift the polarity of the channel 19, thereby increasing the threshold voltage of the channel and restricting current flow from the source 16 to the drain 18.

To program a single FEM cell 50 to a "1" digital logic (the high threshold state), a positive voltage of from about 3 to 8 V is applied to the bottom electrode 26 via the bit line (drain 18), while the top electrode 30 is grounded via the word line (upper polysilicon layer 36). The voltage potential thus created is in amount greater than the coercive voltage, which is the voltage necessary to change the polarization state of the ferroelectric material 28. This causes the ferroelectric material 28 to polarize in an upward (or positive) direction. Once the voltage potential is removed, the ferroelectric material 28 substantially maintains the voltage-induced positive polarization, and now resides in one of its bi-stable polarization states where a small amount of positive charge is located at the interface of the ferroelectric material 28 and the top electrode 30, and a small amount of negative charge is located at the interface of the ferroelectric material 28 and the bottom electrode 26. This negative charge at the bottom interface in turn induces a small positive charge build-up in the channel 19, thus increasing the threshold voltage between the source 16 and the drain 18.

To program (or erase) the FEM cell 50 to a "0" digital logic (the low threshold state), a positive voltage of from about 3 to 8 V is applied to the top electrode via the word line, while the bottom electrode 26 is grounded via the bit line. Now the ferroelectric material 28 polarizes in a downward (or negative) direction. Once the voltage potential is removed, the ferroelectric material 28 remains in its other bi-stable polarization state, and in a similar manner to the description above, induces a small negative charge build-up in the channel 19, thus decreasing the threshold voltage between the source 16 and the drain 18.

To read the programmed FEM cell 50, a positive voltage of from about 3 to 8 V is applied to both the word line and the bit line, while the source line is grounded. Sense circuitry incorporated into the memory cell array then detects the amount of current flowing from the drain 18 to the source 16 across channel 19, which current is determined by the polarization-dependent threshold voltage induced by the programmed ferroelectric material. The sense circuitry thus determines whether the FEM cell 50 is holding a "1" or a "0" digital logic, and this information is then forwarded to be processed as needed by other electronic circuitry. It is noted that the information held by the FEM cell 50 is not destroyed during the read process, thus advantageously eliminating the need to re-program the cell after it has been read. This preserves the longevity of the ferroelectric material 28, which is subject to fatigue as the number of switching operations increases.

It should be appreciated that the FEM cell fabrication method disclosed herein comprises a part of a complete integrated circuit fabrication process for forming non-volatile memory or similar devices. It is understood that the FEM cell and method for making the same may be applicable to other semiconductor technologies where ferroelectric materials are employed.

In summary, the FEM cell disclosed herein enables highly compact memory cell arrays by utilizing both drain side electrical coupling of the drain and FEM gate unit and memory cell source line sharing. FRAMs having a memory density exceeding 16 Mbits are possible using this FEM cell. Moreover, the FEM cell is fabricated using procedures known in the art. Because the reading of the present FEM cell is non-destructive, no re-writing of cell is necessary after a read operation is performed, and the operating lifetime of the ferroelectric material is prolonged. The FEM cell of the present invention may be the primary component of a memory cell as described herein, or it may be coupled to other transistors by conventional means that are well known to one of skill in the art.

The present claimed invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed and desired to be secured by United States Letters Patent is:

1. A ferroelectric memory cell, comprising:
   a semiconductor substrate having:
      a source that serves both as the source for the ferroelectric memory cell and the source for an adjacent memory cell;
      a drain in a spaced apart configuration with respect to the source and drains and sources of adjacent ferroelectric memory cells, wherein the drain is not included as a component of the adjacent ferroelectric memory cell; and
      a channel;
   a gate oxide substantially covering the drain, source, and channel;
   a ferroelectric gate unit positioned on said gate oxide layer, the ferroelectric gate unit asymmetrically overlying the drain with respect to the source, the ferroelectric gate unit comprising:
      a bottom electrode in electrical communication with said drain;
      a top electrode;
      a ferroelectric layer disposed between said bottom and said top electrode; and
      a sealing layer disposed on each side of said ferroelectric gate unit; and
   an upper conductive layer disposed on said ferroelectric gate unit and a portion of said gate oxide layer such that said upper conductive layer and said top electrode of said ferroelectric gate unit are in electrical communication.

2. A ferroelectric memory cell as defined in claim 1, wherein the ferroelectric gate unit is positioned such that it overlies the entirety of the drain.

3. A ferroelectric memory cell array, comprising:
    first and second ferroelectric memory cells that are positioned adjacent one another on a semiconductor substrate, the first ferroelectric memory cell including:
        a source defined in the semiconductor substrate that is configured for use as the source for both the first and second ferroelectric memory cells;
        a first drain defined in the semiconductor substrate in a spaced apart configuration with respect to both a second drain of the second ferroelectric memory cell and the source, wherein the first drain is not included as a component of the second ferroelectric memory cell;
        a channel defined in the semiconductor substrate;
        a gate oxide substantially covering the first drain, source, and channel;
        a ferroelectric gate unit positioned on said gate oxide layer, the ferroelectric gate unit asymmetrically overlying the first drain with respect to the source, the ferroelectric gate unit comprising:
            a bottom electrode in electrical communication with the first drain;
            a top electrode;
            a ferroelectric layer disposed between said bottom and said top electrode; and
            a sealing layer disposed on each side of said ferroelectric gate unit; and
        an upper conductive layer disposed on said ferroelectric gate unit and a portion of said gate oxide layer such that said upper conductive layer and said top electrode of said ferroelectric gate unit are in electrical communication.

4. The ferroelectric memory cell array as defined in claim 3, wherein the second ferroelectric memory cell includes the source and the second drain, the second drain being in a spaced apart configuration with respect to the first drain and the source, and wherein the second drain is not included as a component of the first ferroelectric memory cell.

5. A ferroelectric memory cell comprising:
    a semiconductor substrate having:
        a single source that serves as the source for both the ferroelectric memory cell and an adjacent ferroelectric memory cell;
        a drain that is spaced apart from the source and from drains and sources of adjacent ferroelectric memory cells, wherein the drain is not shared with the adjacent ferroelectric memory cell; and
        a channel defined between the source and the drain;
    a gate oxide substantially covering the drain, source, and channel;
    a ferroelectric gate unit comprising a top electrode, a layer of ferroelectric material, and a bottom electrode, the ferroelectric gate unit being positioned on the gate oxide, wherein the ferroelectric gate unit substantially overlies the entirety of the drain, and wherein the ferroelectric gate unit overlies only a portion of the source; and
    means for controlling the polarization of said layer of ferroelectric material.

6. A ferroelectric memory cell as defined in claim 5, further comprising a lower polysilicon layer deposited between the ferroelectric gate unit and the gate oxide.

7. A ferroelectric memory cell as defined in claim 5, wherein the means for controlling the polarization of said layer of ferroelectric material comprises an electrical connection between said drain and said bottom electrode of said ferroelectric gate unit.

8. A ferroelectric memory cell as defined in claim 7, wherein the means for controlling the polarization of said layer of ferroelectric material further comprises an upper polysilicon layer deposited on top of said ferroelectric gate unit such that electrical communication is established between said top electrode and said upper polysilicon layer.

9. A single transistor ferroelectric memory cell, comprising:
    a semiconductor substrate having defined thereon:
        a first conductive region of a first conductive type;
        a source of a second conductive type defined in said first conductive region, said source sized and configured to comprise the source of the ferroelectric memory cell and the source of an adjacent ferroelectric memory cell; and
        a drain also of a second conductive type defined in said first conductive region, said drain being spaced apart from said source such that a channel region comprising a portion of said first conductive region is defined between said source and said drain, said drain also being spaced apart from sources and drains of adjacent ferroelectric memory cells, wherein said drain is not shared with adjacent ferroelectric memory cells;
    a gate oxide layer disposal on said semiconductor substrate to cover the entirety of said drain, channel region, and source;
    a ferroelectric gate unit positioned on said gate oxide layer such that the ferroelectric gate unit overlies a relatively greater portion of the drain than the source, the ferroelectric gate unit comprising:
        a bottom electrode in electrical communication with said drain;
        a top electrode;
        a ferroelectric layer disposed between said bottom and said top electrode; and
        a sealing layer disposed on each side of said ferroelectric gate unit; and
    an upper conductive layer disposal on said ferroelectric gate unit and a portion of said gate oxide layer such that said upper conductive layer and said top electrode of said ferroelectric gate unit are in electrical communication.

10. A single transistor ferroelectric memory cell as defined in claim 9, wherein said upper conductive layer comprises polysilicon doped to a conductive state.

11. A single transistor ferroelectric memory cell as defined in claim 9, further comprising a plurality of shallow isolation trenches defined in the semiconductor substrate.

12. A single transistor ferroelectric memory cell as defined in claim 9, further comprising a lower polysilicon layer disposed between said gate oxide layer and said bottom electrode, the lower polysilicon layer doped to a conductive state and having a thickness a thickness of from about 500 to 700 Å.

13. A single transistor ferroelectric memory cell as defined in claim 9, wherein said first conductive region of a first conductive type includes ions implanted therein, said ions taken from the group consisting of B and $BF_2$.

14. A single transistor ferroelectric memory cell as defined in claim 9, wherein said source and drain regions of a second conductive type include ions implanted therein, said ions taken from the group consisting of P and As.

15. A single transistor ferroelectric memory cell as defined in claim 1, wherein said bottom and top electrode are composed of material taken from the group consisting of Pt, Ir, IrO$_2$, Ru, and RuO, said bottom and top electrode each having a thickness of about 500 to 1,500 Å.

16. A single transistor ferroelectric memory cell as defined in claim 9, wherein said ferroelectric layer is comprised of material taken from the group consisting of Pb(Zr, Ti)O$_3$, SrBiTa$_2$O$_9$, Pb$_5$Ge$_3$O$_{11}$, and BaTiO$_3$, said ferroelectric layer having a thickness of about 800 to 2,000 Å.

17. A single transistor ferroelectric memory cell as defined in claim 9, wherein said sealing layer comprises material taken from the group consisting of Si$_3$N$_4$ and Al$_2$O$_3$.

18. A single transistor ferroelectric memory cell as defined in claim 9, wherein the spacing between said source region and said drain region is approximately 0.18 to 0.35 μm.

19. A single transistor ferroelectric memory cell as defined in claim 9, wherein the ferroelectric gate unit is positioned such that asymmetric source and drain regions are defined.

* * * * *

UNITED STATES PATENT AND TRADEMARK OFFICE
CERTIFICATE OF CORRECTION

PATENT NO. : 6,960,801 B2  
DATED : November 1, 2005  
INVENTOR(S) : Hsiang-Lan Lung Page 1 of 1

It is certified that error appears in the above-identified patent and that said Letters Patent is hereby corrected as shown below:

<u>Title page,</u>  
Item [56], References Cited, OTHER PUBLICATIONS,  
"Jaeger," reference, change "Publiching" to -- Publishing --, and change "$Sr_2Nb_2O_7$" to -- $Sr_2Nb_2O_7$ --.

<u>Column 4,</u>  
Line 30, after "comprises" remove "of".

<u>Column 8,</u>  
Line 40, change "disposal" to -- disposed --.  
Line 55, after "a thickness" remove "a thickness".  
Line 66, change "claim 1" to -- claim 9 --.

Signed and Sealed this

Twenty-first Day of March, 2006

JON W. DUDAS  
*Director of the United States Patent and Trademark Office*